(12) United States Patent
Ogino

(10) Patent No.: US 10,229,918 B2
(45) Date of Patent: Mar. 12, 2019

(54) METHODS OF FORMING SEMICONDUCTOR DEVICES USING SEMI-BIDIRECTIONAL PATTERNING

(71) Applicant: GLOBALFOUNDRIES Inc., Grand Cayman (KY)

(72) Inventor: Atsushi Ogino, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/662,594

(22) Filed: Jul. 28, 2017

(65) Prior Publication Data

US 2018/0138187 A1    May 17, 2018

Related U.S. Application Data

(62) Division of application No. 15/342,102, filed on Nov. 15, 2016, now Pat. No. 9,748,251.

(51) Int. Cl.

| | |
|---|---|
| *H01L 27/11* | (2006.01) |
| *H01L 21/308* | (2006.01) |
| *H01L 21/318* | (2006.01) |
| *H01L 21/033* | (2006.01) |
| *H01L 27/02* | (2006.01) |

(Continued)

(52) U.S. Cl.
CPC ...... *H01L 27/1116* (2013.01); *H01L 21/0332* (2013.01); *H01L 21/0337* (2013.01); *H01L 21/31144* (2013.01); *H01L 27/0207* (2013.01); *H01L 27/1104* (2013.01); *H01L 27/11582* (2013.01); *H01L 28/00* (2013.01)

(58) Field of Classification Search
CPC .......... H01L 21/32244; H01L 21/0332; H01L 21/0337; H01L 21/3081; H01L 21/31144; H01L 21/0207; H01L 27/11582; H01L 28/00; H01L 21/02164
See application file for complete search history.

(56) References Cited

U.S. PATENT DOCUMENTS

| | | | |
|---|---|---|---|
| 9,818,640 B1 * | 11/2017 | Stephens | ........... H01L 21/76816 |
| 2005/0208742 A1 * | 9/2005 | America | ............. H01L 21/0332 |
| | | | 438/586 |

(Continued)

OTHER PUBLICATIONS

Taiwanese Search Report, dated Aug. 29, 2018, for corresponding Taiwan Patent Application No. 106124124.

*Primary Examiner* — Jasmine Clark
(74) *Attorney, Agent, or Firm* — Thompson Hine LLP; Francois Pagette

(57) ABSTRACT

Devices and methods of fabricating integrated circuit devices using semi-bidirectional patterning are provided. One method includes, for instance: obtaining an intermediate semiconductor device having a dielectric layer, a first, a second, and a third hardmask layer, and a lithography stack; patterning a first set of lines; patterning a second set of lines between the first set of lines; etching to define a combination of the first and second set of lines; depositing a second lithography stack; patterning a third set of lines in a direction perpendicular to the first and second set of lines; etching to define the third set of lines, leaving an OPL; depositing a spacer over the OPL; etching the spacer, leaving a vertical set of spacers; and etching the second hardmask layer using the third hardmask layer and the set of vertical spacers as masks.

6 Claims, 15 Drawing Sheets

(51) Int. Cl.
*H01L 21/311* (2006.01)
*H01L 27/11582* (2017.01)
*H01L 49/02* (2006.01)

(56) References Cited

U.S. PATENT DOCUMENTS

| | | |
|---|---|---|
| 2005/0215039 A1 | 9/2005 | Hill et al. |
| 2010/0098940 A1 | 4/2010 | Liu et al. |
| 2012/0223418 A1 | 9/2012 | Stowers et al. |
| 2015/0056800 A1 | 2/2015 | Mebarki et al. |

\* cited by examiner

METHODS OF FORMING SEMICONDUCTOR DEVICES USING SEMI-BIDIRECTIONAL PATTERNING

CROSS-REFERENCE TO RELATED APPLICATIONS

This application is a divisional application of U.S. patent application Ser. No. 15/352,102, filed Nov. 15, 2016, now U.S. Pat. No. 9,748,251, and entitled "METHODS OF FORMING SEMICONDUCTOR DEVICES USING SEMI-BIDIRECTIONAL PATTERNING," the entirety of which is hereby incorporated herein by reference.

FIELD OF THE INVENTION

The present invention relates to methods of fabricating semiconductor devices, and more particularly, to methods of using semi-bidirectional patterning with critical spacing control.

BACKGROUND OF THE INVENTION

For 64 nanometer (nm) and below pitch in nodes, especially in 7 nm nodes, self-aligned double patterning (SADP) of the nodes presents challenges. For instance, power rails become a challenge due to the ability to connect, for example, the metal 1, 2, and 3 areas require more directionality for metal orientation and end up like a "staple" rather than the traditional "rail." The limited pattern variation does not allow for proper spacing and patterning of the nodes to control the end structure.

Therefore, it may be desirable to develop methods of fabricating nodes with semi-bidirectional patterning.

BRIEF SUMMARY

The shortcomings of the prior art are overcome and additional advantage are provided through the provisions, in one aspect, a method that includes, for instance: obtaining an intermediate semiconductor device having a dielectric layer, a first hardmask layer, a second hardmask layer, a third hardmask layer, and a lithography stack; patterning a first set of lines in a first direction; patterning a second set of lines in the first direction between the first set of lines; etching the lithography stack to define a combination of the first and second set of lines in the third hardmask layer; depositing a second lithography stack over the second hardmask layer and the third hardmask layer; patterning a third set of lines in a second direction perpendicular to the first and second set of lines; etching the second lithography stack defining the third set of lines in the third hardmask layer, leaving an optical planarization layer (OPL) above the third hardmask layer where the third set of lines was not etched; depositing a spacer over the OPL and over the second hardmask layer in the third set of lines; etching the spacer, leaving a set of vertical spacers lining the third set of lines; removing the OPL; and etching the second harkdmask layer using the third hardmask layer and the set of vertical spacers as masks.

In another aspect, an intermediate semiconductor device is provided which includes, for instance: a dielectric layer, a first hardmask layer, a set of nitride lines periodically in a first direction approximately 15 nm to approximately 35 nm wide, and a set of connecting nitride lines in a second direction approximately 10 nm to approximately 30 nm wide, wherein a width of the set of connecting nitride lines is less than a width of the set of nitride lines.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for unique structures utilizing a semi-bidirectional patterning method.

Figure 1:
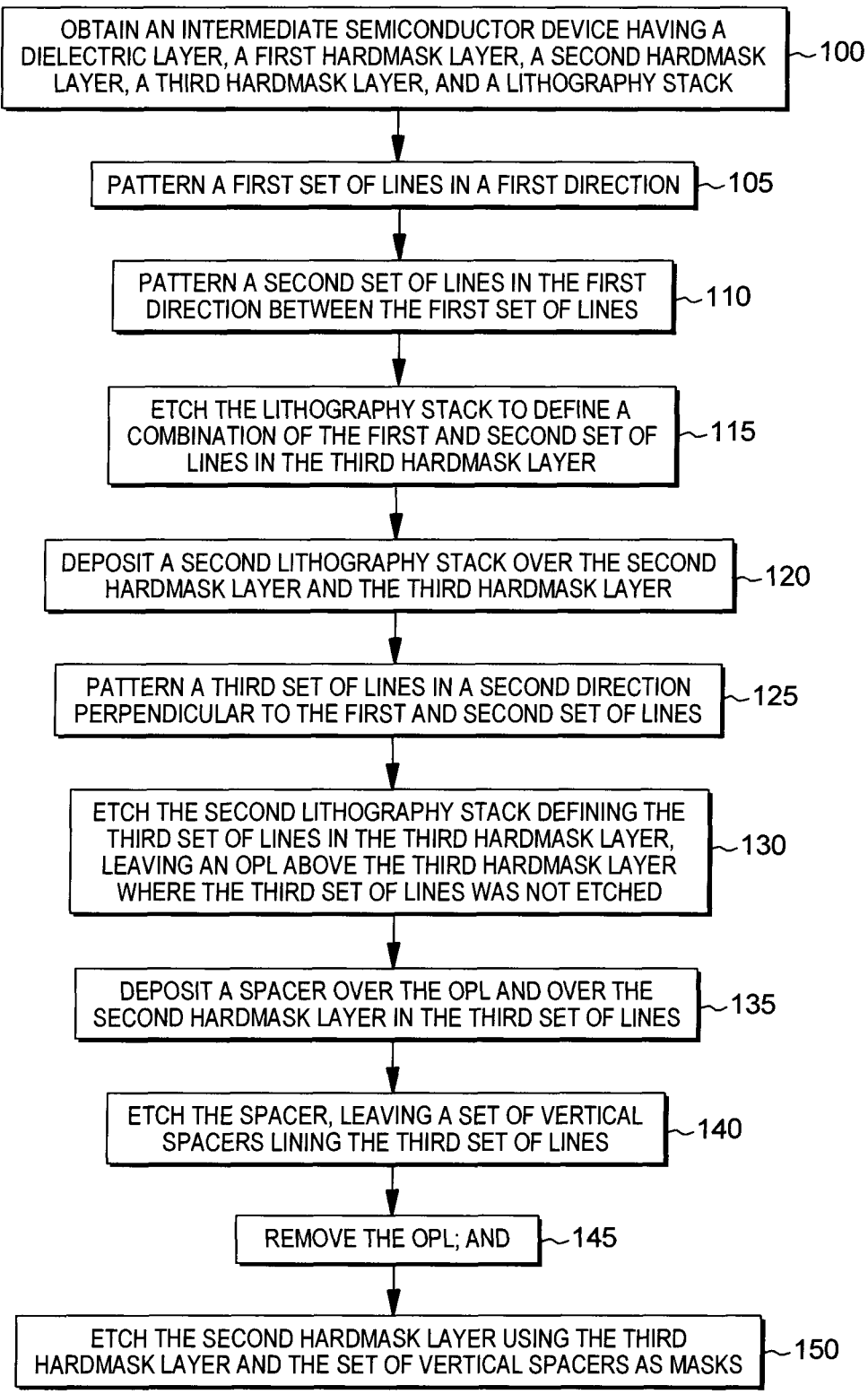
FIG. 1 depicts one embodiment of a method for forming an intermediate semiconductor interconnect structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor interconnect device having a dielectric layer, a first hardmask layer, a second hardmask layer, a third hardmask layer, and a lithography stack 100; patterning a first set of lines in a first direction 105; patterning a second set of lines in the first direction between the first set of lines 110; etching the lithography stack to define a combination of the first and second set of lines in the third hardmask layer 115; depositing a second lithography stack over the second hardmask layer and the third hardmask layer 120; patterning a third set of lines in a second direction perpendicular to the first and second set of lines 125; etching the second lithography stack defining the third set of lines in the third hardmask layer, leaving an OPL above the third hardmask layer where the third set of lines was not etched 130; depositing a spacer over the OPL and over the second hardmask layer in the third set of lines 135; etching the spacer, leaving a set of vertical spacers lining the third set of lines 140; removing the OPL 145, and etching the second hardmask layer using the third hardmask layer and the set of vertical spacers as masks 150.

FIGS. 2-10 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2A:
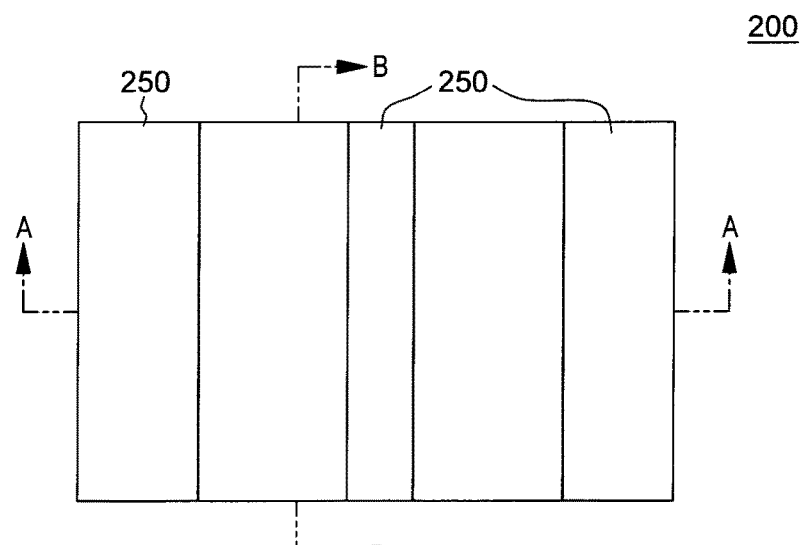
FIG. 2A depicts a top down view of one embodiment of an intermediate semiconductor interconnect structure having a dielectric layer, a first hardmask layer, a second hardmask layer, a third hardmask layer, and a lithography stack with a first set of lines patterned, in accordance with one or more aspects of the present invention.

FIG. 2A shows a portion of an intermediate semiconductor device generally denoted 200, depicted at an intermediate semiconductor fabrication stage. In these embodiments and as illustrated, device 200 may be a logic device, including but not limited to a 6T logic device or a 7.5T logic device. The device 200 may have been processed through initial device processing steps in accordance with the design of the device 200 being fabricated. For example, the device 200 may include, for instance, a dielectric layer 205, which may include any material with a smaller dielectric constant (k) than silicon dioxide. This layer can act as a substrate, or may be deposited on a substrate (not shown). Dielectric layer 205 can include any dielectric materials, including but not limited to any inorganic dielectric materials, organic dielectric materials, or combinations thereof. Suitable dielectric materials can include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied. Materials). Examples of carbon-doped silicon dioxide materials, or organosilanes, include Black Diamond™ (available from Applied Materials) and Coral™ (available from Novellus). An example of an HSQ material is $FO_x$™ (available from Dow Corning). In some embodiments, dielectric materials include organic polymeric thermoset materials, consisting essentially of carbon, oxygen, and hydrogen Additionally, dielectric materials may include the low-k polyarylene ether polymeric material known as SiLK™ (available from The Dow Chemical Company), and the low-k polymeric material known as FLARE™ (available from Honeywell).

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

Still referring to FIG. 2A, above the dielectric layer 205 may be a first hardmask layer 210, such as SacSiN, SiN, $SiO_2$, SiON, or other masking materials, which may be exposed in the final device 200. Above this can be a second hardmask layer 215, for instance SiN, $SiO_2$, SiON, or a nitride material such as titanium nitride (TiN), which is typically different from the first hardmask layer 210. Above this may be a third hardmask layer 220, which may consist of any of the above described hardmask materials. While three hardmask layers are described, any number of hardmask layers may be used. Above the hardmask layers 210, 215, and 220, is a lithography stack 225. The lithography stack 225 can include multiple layers and can vary depending on the type of lithography used for patterning and etching device 200. For instance, lithography stack 225 may include an optical planarization layer (OPL) 230, a SiON layer 235, a bottom antireflective coating (BARC) layer 240, and a photoresist layer 245. These materials may vary, and the disclosure should be understood to include any variation and combination of layers useful in lithography and etching techniques relevant to the art.

Figure 2B:
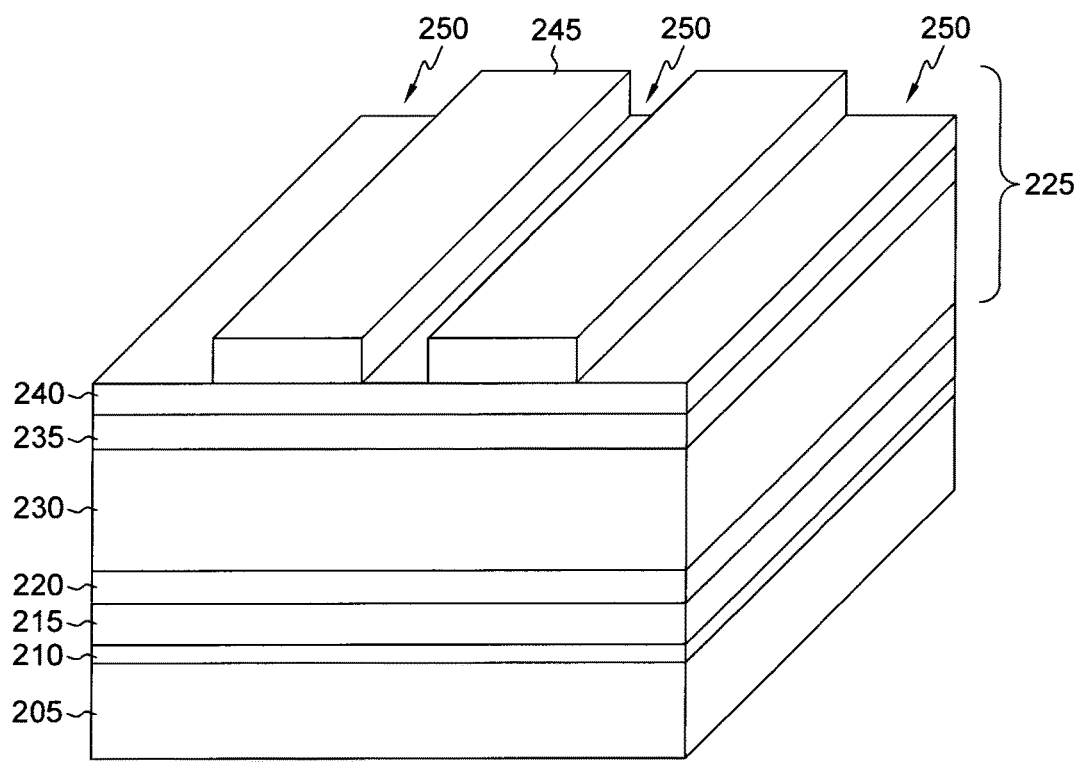
FIG. 2B depicts a cross-sectional elevation isometric three-dimensional view of the structure of FIG. 2A, in accordance with one or more aspects of the present invention.

As depicted in FIG. 2B, a first set of lines 250 may be patterned in a first direction. As can be seen in FIG. 2B, patterning may include exposing the photoresist layer 245 to a light that will remove the photoresist layer 245 in the shape of the first set of lines 250.

Figure 3A:
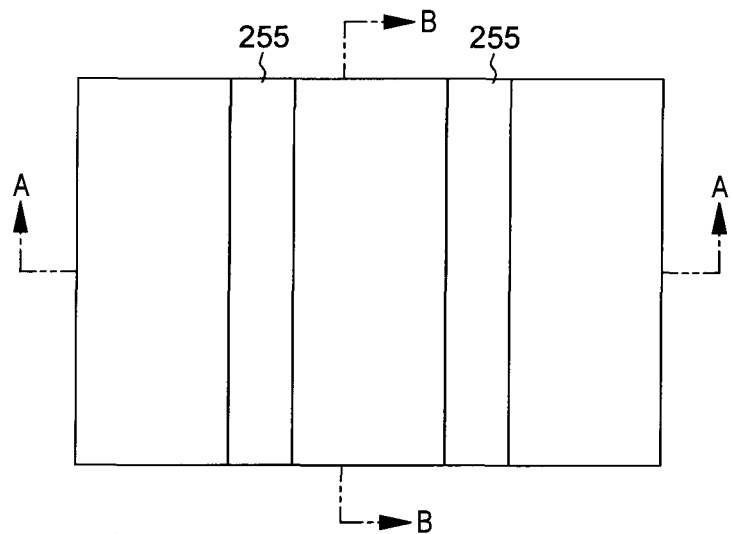
FIG. 3A depicts the structure of FIG. 2A after patterning a second set of lines, in accordance with one or more aspects of the present invention.
Figure 3B:
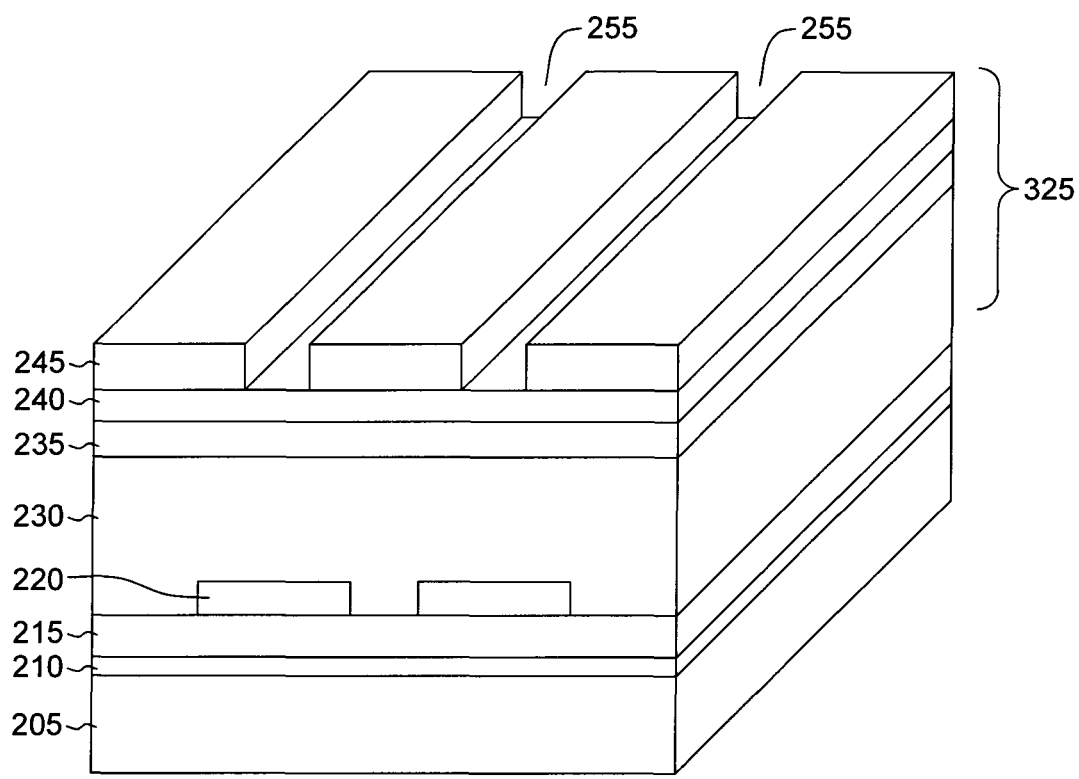
FIG. 3B depicts a cross-sectional elevation isometric three-dimensional view of the structure of FIG. 3A, in accordance with one or more aspects of the present invention.

As depicted in FIG. 3A, in order to create smaller lines, for instance in an interconnect device, a second set of lines 255 may be patterned, either in the same lithography stack 225 or in a new lithography stack 325, as shown in FIG. 3B. The second set of lines 255 may be patterned in the same first direction of the first set of lines 250, and may be between the first set of lines 250 to narrow spaces between the two sets of lines. As depicted in FIG. 3B, the first set of lines are etched into the third hardmask layer 220 before adding the new lithography stack 325, which can include the same layers and materials as the first lithography stack 225.

Figure 4A:
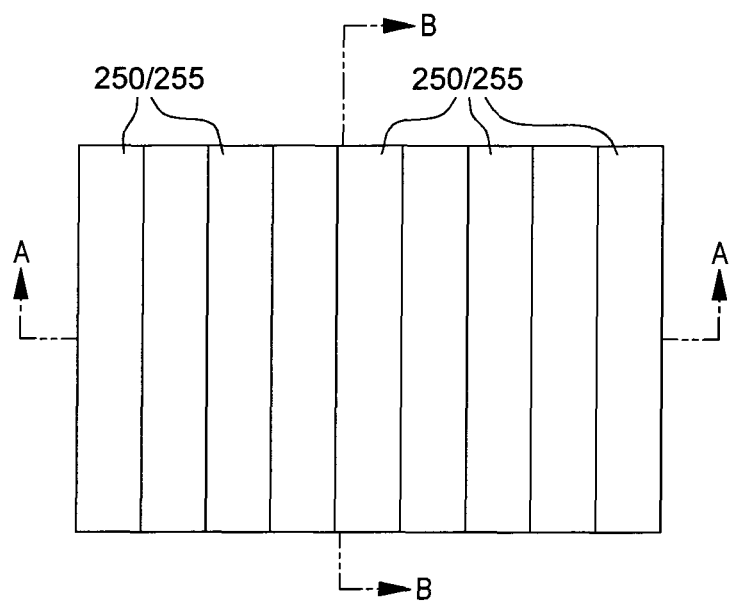
FIG. 4A depicts the structure of FIG. 3A after etching the lithography stack to define a combination of the first and second set of lines in the third hardmask layer, in accordance with one or more aspects of the present invention.
Figure 4B:
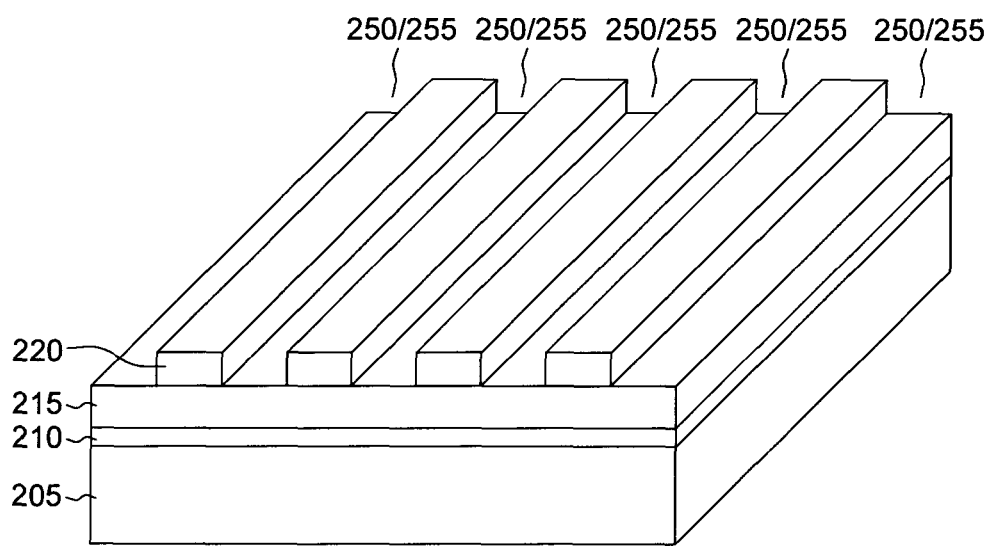
FIG. 4B depicts a cross-sectional elevation isometric three-dimensional view of the structure of FIG. 4A, in accordance with one or more aspects of the present invention.

As depicted in FIG. 4A, the lithography stack 225 and/or 325 may both be patterned creating a pattern of the combination of lines. As depicted in FIG. 4B, the combined pattern may be etched, removing the lithography stacks, in order to define a combination of the first set of lines 250 and the second set of lines 255 into the third hardmask layer 220. For instance, when the second set of lines 255 is between the first set of lines 250, each adjacent line may be approximately 26 nm apart from one another once etched in combination. The process described and illustrated in FIGS. 2-4 are sometimes referred to as LELE, or lithography-etch/lithography-etch due to the patterning and etching of two distinct sets of lines 250 and 255. In embodiments where device 200 is a logic device, the first and second set of lines 250/255 may be approximately 30 nm wide.

Figure 5A:
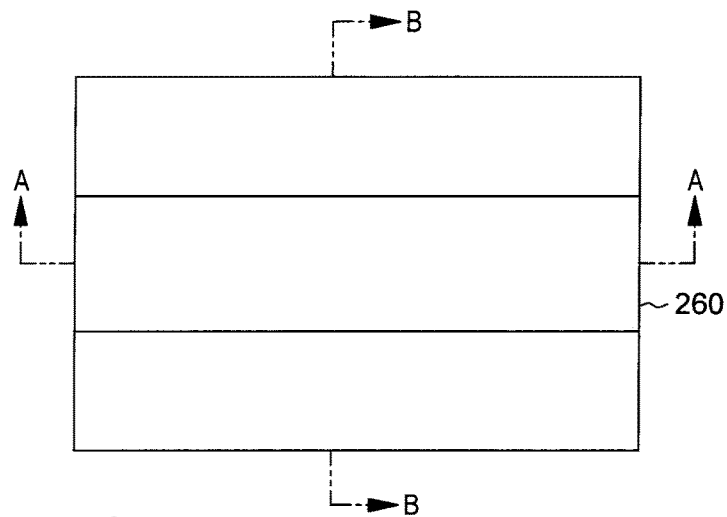
FIG. 5A depicts the structure of FIG. 4A after depositing a second lithography stack and patterning a third set of lines, in accordance with one or more aspects of the present invention.
Figure 5B:
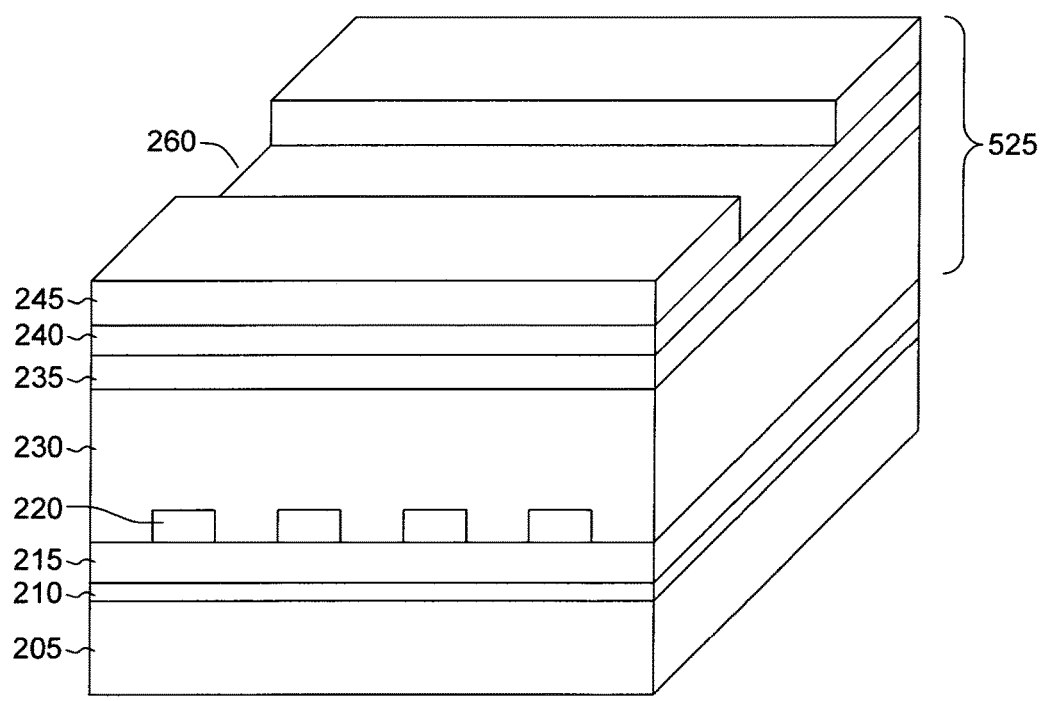
FIG. 5B depicts a cross-sectional elevation isometric three-dimensional view of the structure of FIG. 5A, in accordance with one or more aspects of the present invention.

As depicted in FIG. 5A, following the etching of the combination of the first two sets of lines, a third set of lines 260 may be patterned in a second direction, for instance perpendicular to the direction of the first two sets of lines 250/255. As depicted in FIG. 5B, in order to pattern the third set of lines 260, a second lithography stack 525 may be deposited over the second hardmask layer 215, which is defined and exposed by the etching of the first and second set of lines 250/255, and over the third hardmask layer 220, which is now defined by the space between the first two sets of lines 250 and 255. As can be seen in FIG. 5B, these lines run perpendicular to the previous lines, and are patterned in a similar photoresist layer 245 of a lithography stack 525 (FIG. 5A) as the first two sets of lines.

Figure 6A:
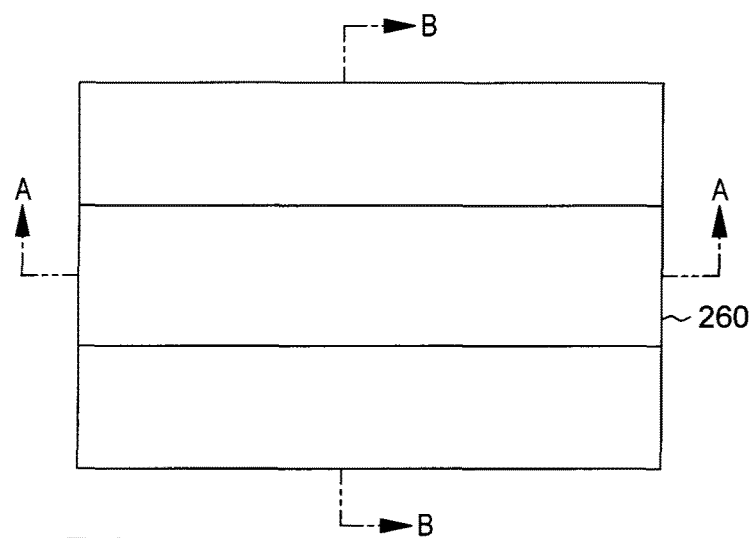
FIG. 6A depicts the structure of FIG. 5A after etching the second lithography stack to define the third set of lines in the third hardmask layer, leaving an OPL above the third hardmask layer where the third set of lines was not etched, in accordance with one or more aspects of the present invention.
Figure 6B:
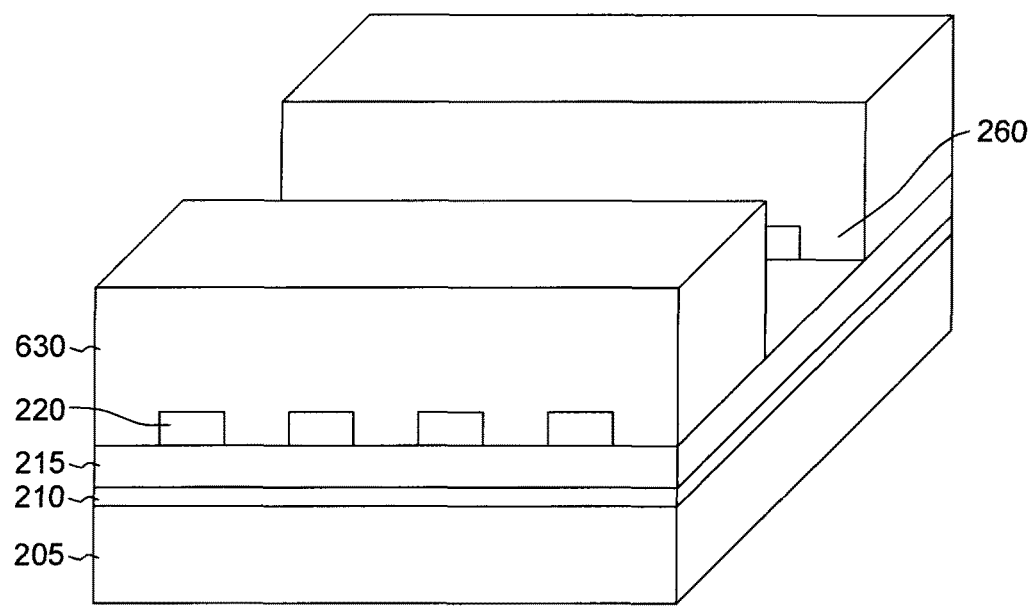
FIG. 6B depicts a cross-sectional elevation isometric three-dimensional view of the structure of FIG. 6A, in accordance with one or more aspects of the present invention.

As depicted in FIG. 6A, the third set of lines 260 are provided in the second direction. FIG. 6B depicts that the second lithography stack 525 may be etched, defining the third set of lines 260 in the underlying third hardmask layer 220, essentially causing a grid pattern in combination with the first and second set of lines 250/255, but leaving an OPL 630, usually left behind after etching second lithography stack 525, but it may be added after etching. In any event, OPL 630 should only be above the areas not etched in etching the third set of lines 260. In embodiments where device 200 is a logic device, each line of the third set of lines 260 may be approximately 164 nm apart for a 6T logic device, or approximately 226 nm apart for a 7.5T logic device. The third set of lines 260 may be approximately 76 nm wide. These widths are approximate and can include +/−5 nm. It should also be understood that these values are for a particular logic device, but can vary depending on the logic device desired.

Figure 7A:
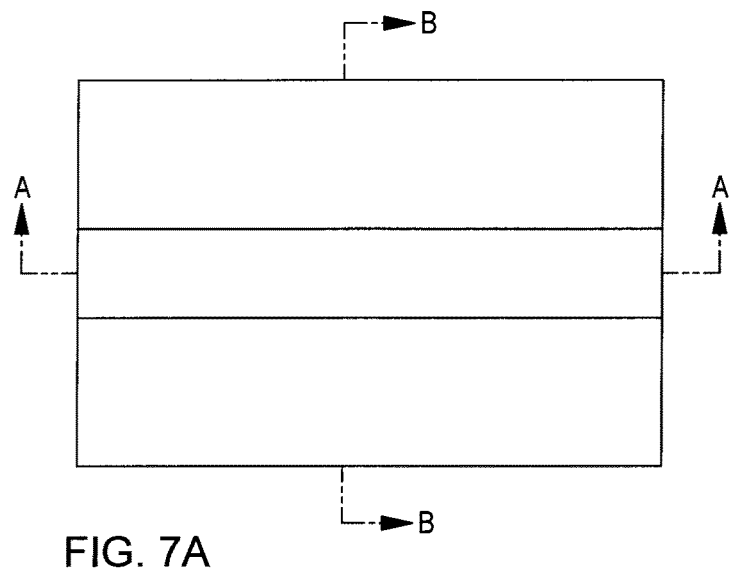
FIG. 7A depicts the structure of FIG. 6A after depositing a spacer over the OPL and the second hardmask layer in the third set of lines and etching the spacer, leaving a vertical set of spacers, in accordance with one or more aspects of the present invention.
Figure 7B:
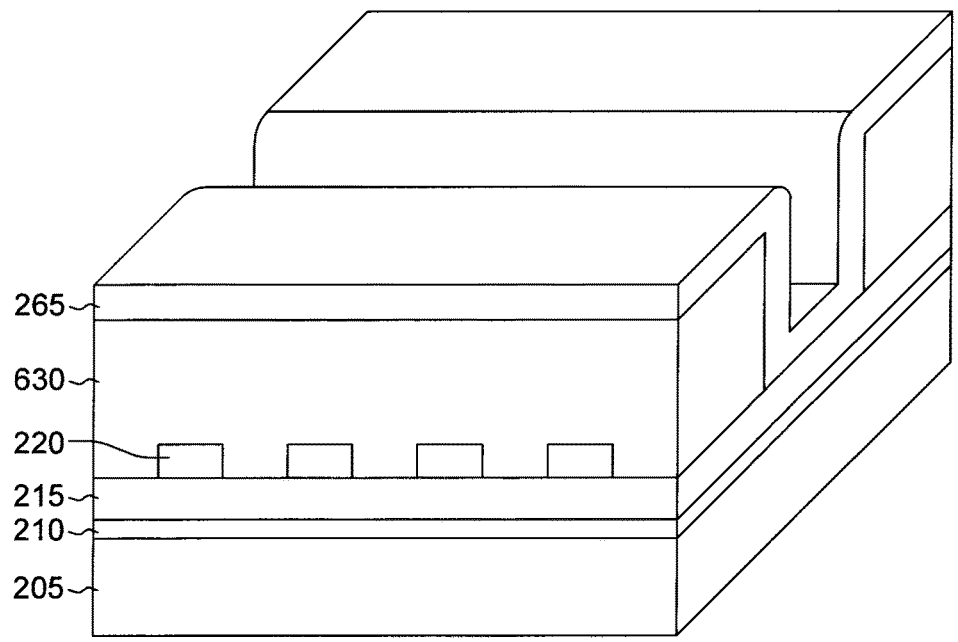
FIG. 7B depicts a cross-sectional elevation isometric three-dimensional view of the structure of FIG. 7A, in accordance with one or more aspects of the present invention.
Figure 7C:
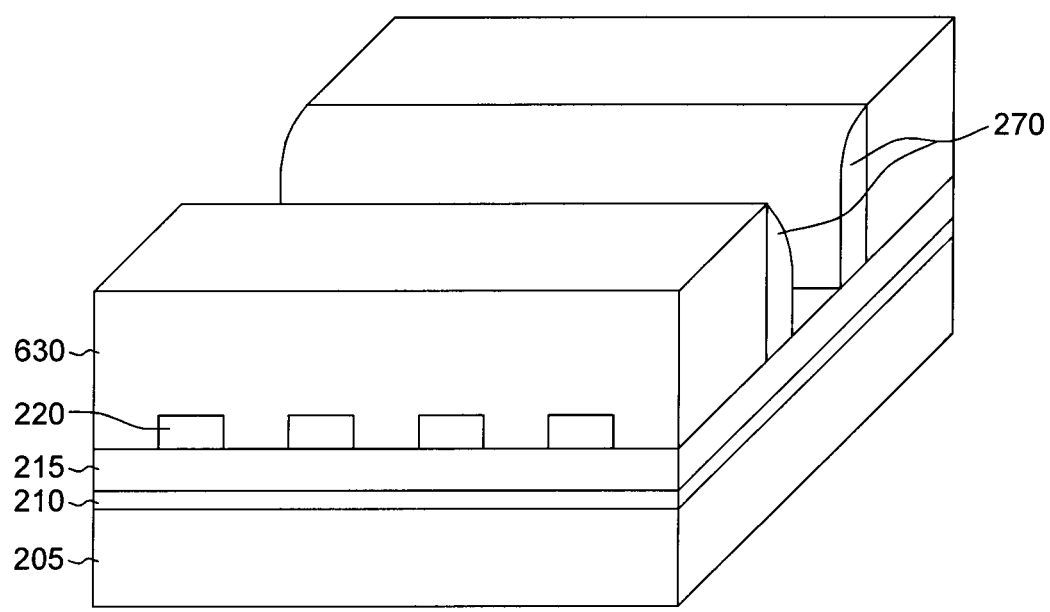
FIG. 7C depicts the structure of FIG. 7B after etching the spacer, in accordance with one or more aspects of the present invention.

As depicted in FIGS. 7A and 7B, a spacer 265 is deposited over the OPL 630 where it exists, and over the second hardmask layer 215 in the third set of lines 260. As can be seen in FIG. 7B, the spacer 265 forms on a top surface of the OPL 630 and lines the walls of and bottom of the third set of lines 260. The spacer 265 can include an oxide mask, for instance $SiO_2$. It may be deposited, for example, by atomic layer deposition (ALD) in order to form an even layer over all surfaces. FIG. 7C depict device 200 following etching of the spacer 265, wherein a set of vertical spacers 270 are formed by etching the spacer, effectively removing any horizontal portions of spacer 265, both the portions over the OPL 630 and the second hardmask layer 215 at the bottom of third set of lines 260. The processes illustrated in FIGS. 6-7 may be considered a self-aligned patterning (SAP) due to the use of spacers in the etched third set of lines 260. Thus, in some embodiments, aspects of the current disclosure include a novel combination of LELE techniques and SAP techniques to form a new structure.

Figure 8A:
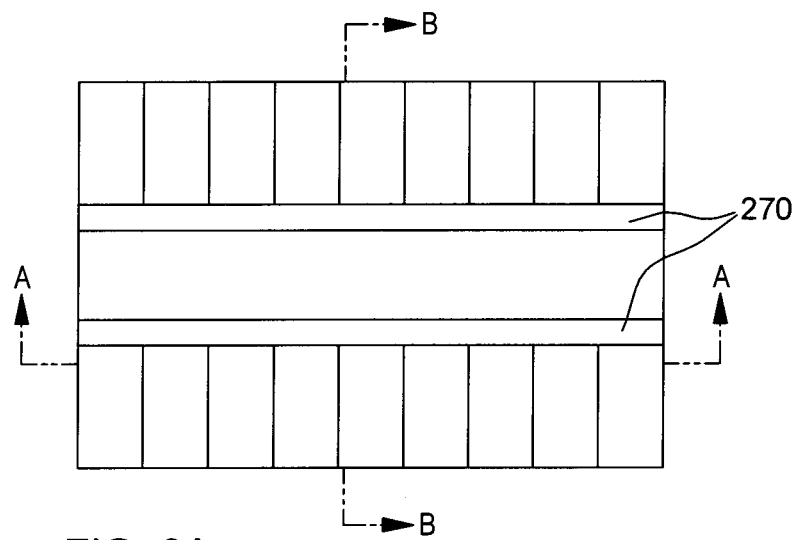
FIG. 8A depicts the structure of FIG. 7C after removing the OPL, in accordance with one or more aspects of the present invention.
Figure 8B:
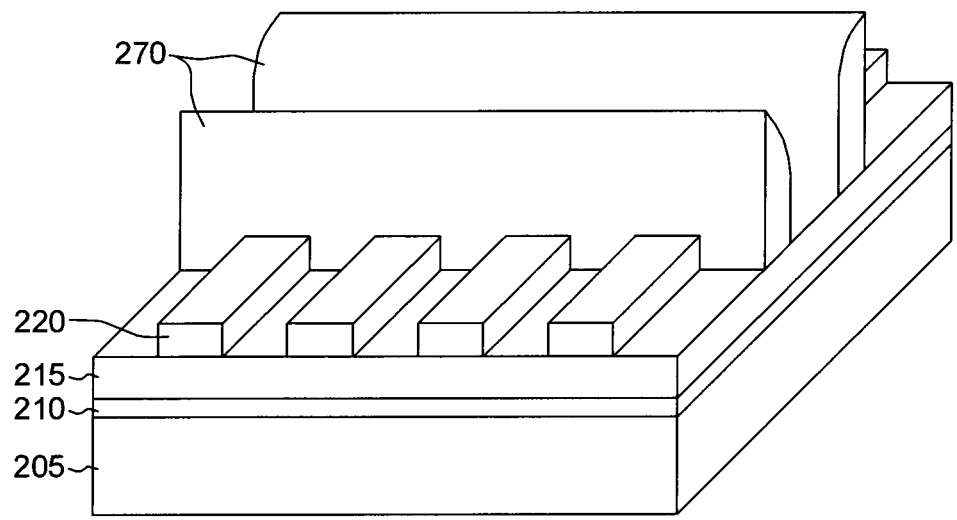
FIG. 8B depicts a cross-sectional elevation isometric three-dimensional view of the structure of FIG. 8A, in accordance with one or more aspects of the present invention.

As depicted in FIG. 8A, the OPL 630 may be removed, leaving behind the combined pattern of the parallel first and second set of lines 250/255, broken by the perpendicular third set of lines 260 and, parallel to third set of lines 260, the set of vertical spacers 270. FIG. 8B shows a three-dimensional view of the set of vertical spacer 270.

Figure 9A:
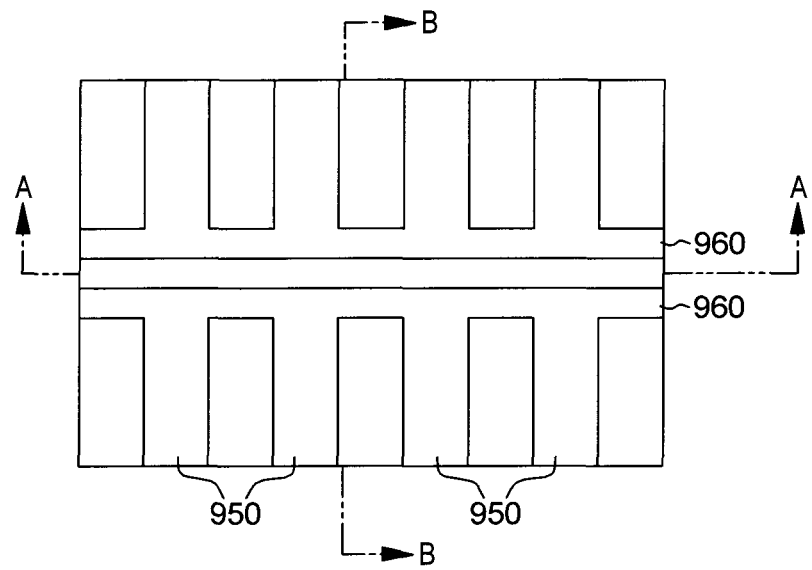
FIG. 9A depicts the structure of FIG. 8A after etching the second hardmask layer using the third hardmask layer and the set of vertical spacers as a mask, in accordance with one or more aspects of the present invention.
Figure 9B:
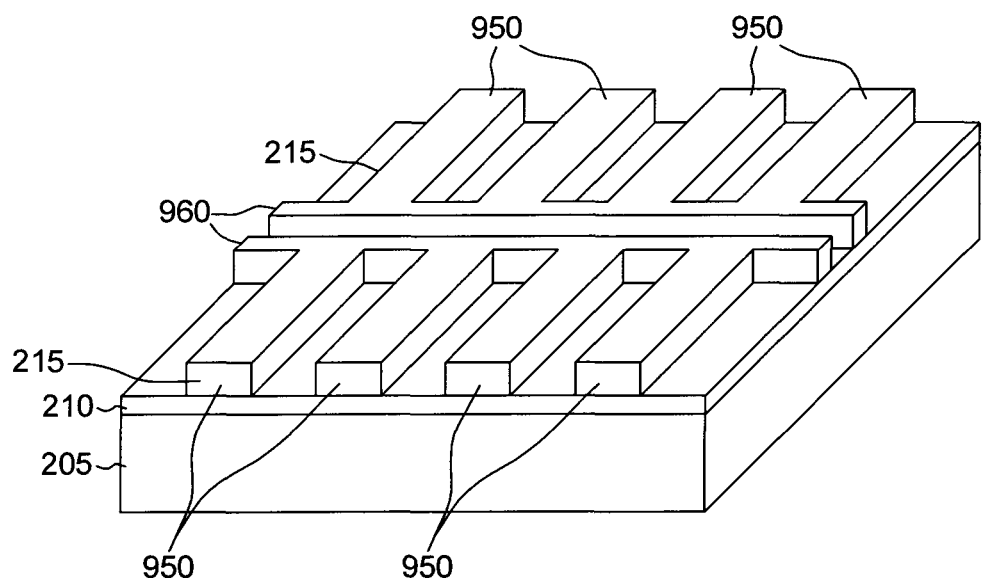
FIG. 9B depicts a cross-sectional elevation isometric three-dimensional view of the structure of FIG. 9A, in accordance with one or more aspects of the present invention.

A depicted in FIGS. 9A and 9B, the third hardmask layer remaining between all sets of lines and the set of vertical spacers 270 act as a mask for etching the underlying second hardmask layer 215 to form the grid pattern illustrated. As such, a device 200 is illustrated in FIGS. 9A and 9B which includes the dielectric layer 205, the first hardmask layer 210, which is partially exposed by areas not covered by the remaining second hardmask layer 215. For instance, the remaining second hardmask layer 215 has been etched to form a set of nitride lines 950 periodically, left behind by the first and second set of lines 250/255, FIGS. 2A and 3A. Also formed is a set of connecting nitride lines 960 from the third set of lines 260, FIG. 5A.

Figure 10:
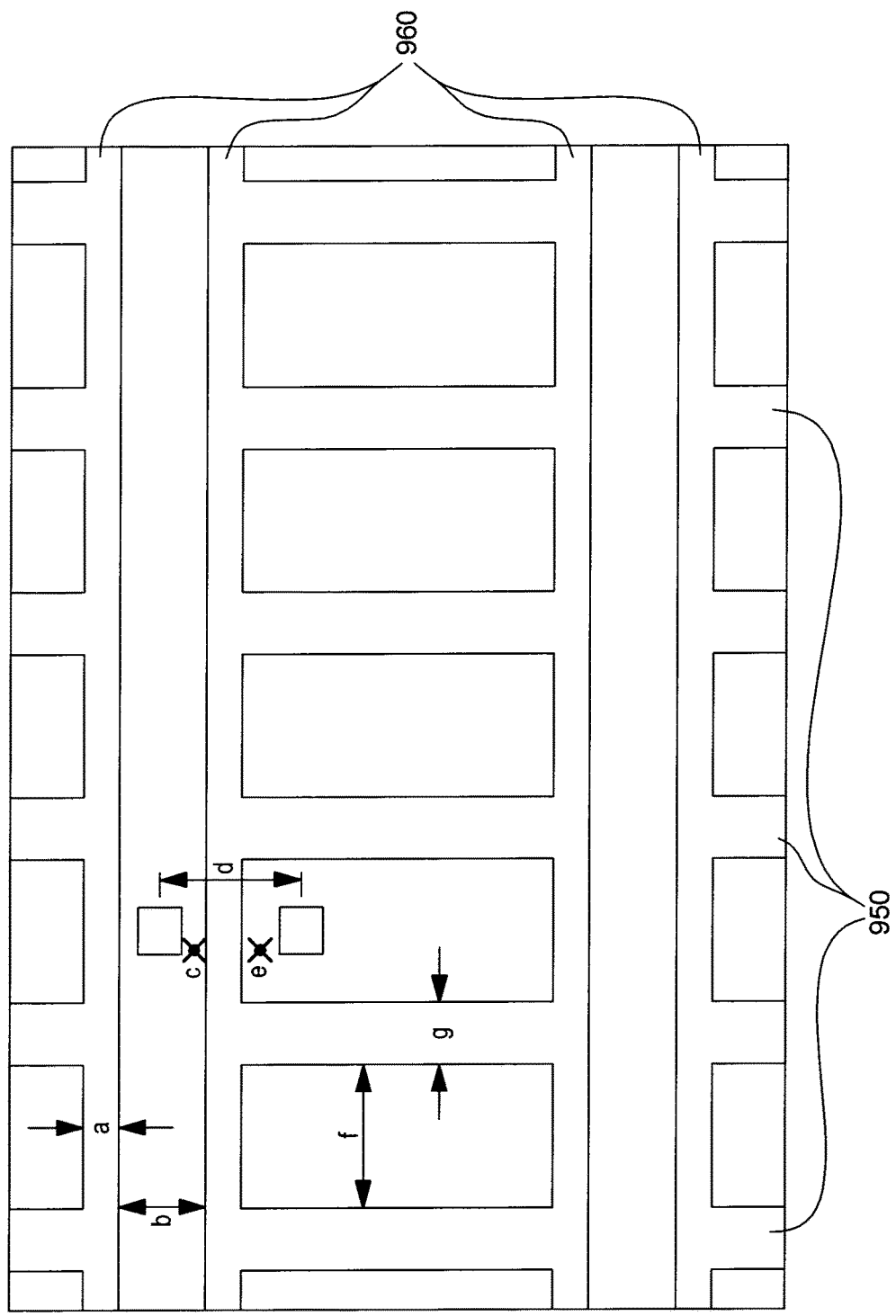
FIG. 10 depicts an expanded top down view of the structure of FIG. 9A following processing of the device, detailing the result of the patterning, in accordance with one or more aspects of the present invention.

As illustrated in FIG. 10, following formation of the nitride lines, the resulting pattern is used to form a cell using known BEOL processing techniques. For instance, using the pattern as a hardmask, the structure is etched again and the trench and vias are filled with a metal, such as copper, and polished to achieve the structure seen in FIG. 10. This demonstrates the spacing possible between the lines according to some embodiments, to form a bidirectional set of metal lines. For instance, the set of lines 950 are approximately 15 nm wide to approximately 35 nm wide, in some embodiments approximately 26 nm wide. This width is determined by the lithography steps described above. The set of connecting lines are approximately 10 nm to approximately 30 nm wide, in some embodiments approximately 20 nm wide, which is defined by the spacer thickness, and oriented in a perpendicular direction, and typically smaller than the width of the first set of lines due to the process differences. In embodiments where device 200 includes a logic device, the nitride lines may be approximately 30 nm apart, typically uniformly. The connecting lines 960, which are typically grouped into sets of two adjacent lines, which can be approximately 36 nm apart from any adjacent line. The lines make up the bit lines of a cell of a logic device, an SRAM cell, or other devices that benefit from the illustrated orientation. These lines are patterned in order to increase the efficiency of the M1 transistor of a cell, and thus can be patterned at spacing necessary to operate the desired logic device cell or the SRAM cell.

Some example distances are illustrated in FIG. 10. For instance, a can be about 20 nm, b can be about 36 nm, c can be about 8 nm, d can be about 60 nm, e can be about 12 nm, f can be about 30 nm, and g can be about 26 nm, wherein about can include plus or minus 20%. It is to be understood that the pattern illustrated in FIG. 10 can be useful, for instance, in a logic device 200, but may be patterned differently and with different spacing depending on the desired structure and function. For instance, a similar method can be used for embodiments involving a cell of a perpendicular orientation, as will be described below.

FIGS. 11-18 depict, by way of example only, one alternative embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 11:
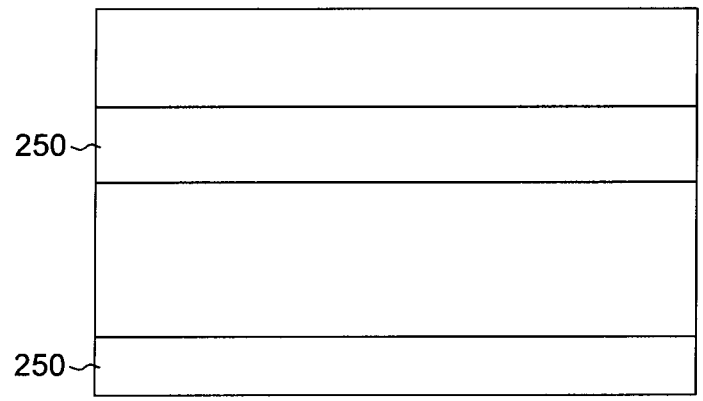
FIG. 11 depicts a top down view of one embodiment of an intermediate semiconductor interconnect structure for an alternative cell oriented in a different direction and having a dielectric layer, a first hardmask layer, a second hardmask layer, a third hardmask layer, and a lithography stack with a first set of lines patterned, in accordance with one or more aspects of the present invention.

FIG. 11 shows a portion of an intermediate semiconductor device generally denoted 200, depicted at an intermediate semiconductor fabrication stage. In these embodiments and as illustrated, device 200 may be an SRAM cell or similar device. The device 200 may have been processed through initial device processing steps in accordance with the design of the device 200 being fabricated. In FIGS. 11-18, only the top down view is shown, as depicting the stacks cutaway are substantially similar to the embodiments illustrated in FIGS. 2-10. Therefore, the reference numerals below refer to the same materials. For example, the device 200 may include, for instance, a dielectric layer 205, which may include any material with a smaller dielectric constant (k) than silicon dioxide. This layer can act as a substrate, or may be deposited on a substrate (not shown).

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

Still referring to FIG. 11, above a dielectric layer 205 may be a first hardmask layer 210, which may be exposed in the final device 200. Above this can be a second hardmask layer 215, for instance titanium nitride (TiN), a third hardmask layer 220, and a lithography stack 225. The lithography stack 225 can include multiple layers and can vary depending on the type of lithography used for patterning and etching device 200. For instance, lithography stack 225 may include an OPL 230, a SiON layer 235, a BARC layer 240, and a photoresist layer 245. These materials may vary, and the disclosure should be understood to include any variation and combination of layers useful in lithography and etching techniques relevant to the art.

As depicted in FIG. 11, a first set of lines 250 may be patterned in a first direction. The patterning may include exposing the photoresist layer 245 to a light that will remove the photoresist layer 245 in the shape of the first set of lines 250.

Figure 12:
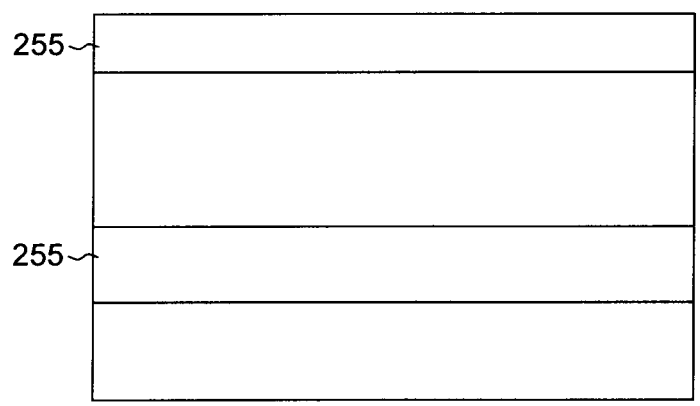
FIG. 12 depicts the structure of FIG. 11 after patterning a second set of lines, in accordance with one or more aspects of the present invention.

As depicted in FIG. 12, in order to create smaller lines, for instance in an interconnect device, a second set of lines 255 may be patterned, either in the same lithography stack 225 or in a new lithography stack 325. The second set of lines 255 may be patterned in the same first direction of the first set of lines 250, and may be between the first set of lines 250 to narrow spaces between the two sets of lines.

Figure 13:
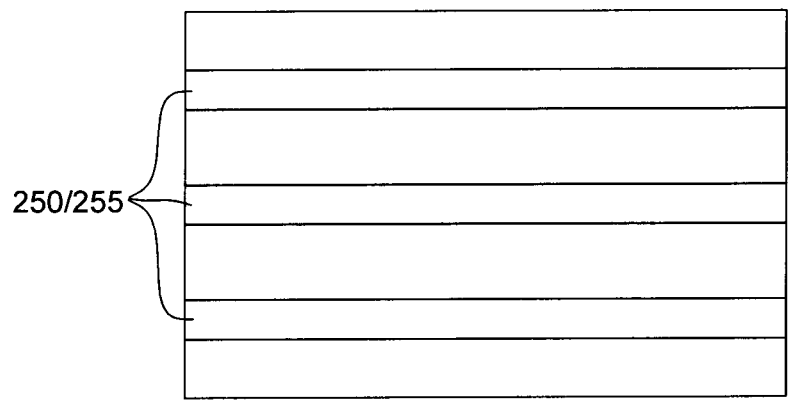
FIG. 13 depicts the structure of FIG. 12 after etching the lithography stack to define a combination of the first and second set of lines in the third hardmask layer, in accordance with one or more aspects of the present invention.

As depicted in FIG. 13, the lithography stack 225 and/or 325 may be etched away to define a combination of the first set of line 250 and the second set of lines 255. For instance, when the second set of lines 255 is between the first set of lines 250, each adjacent line may be approximately 26 nm apart from one another once etched in combination. The process described and illustrated in FIGS. 11-13 are sometimes referred to as LELE, or lithography-etch/lithography-etch due to the patterning and etching of two distinct sets of lines 250 and 255. In embodiments where device 200 is a SRAM cell, the first and second set of lines 250/255 may be approximately 64 nm wide, and typically are oriented perpendicular to those of a logic device as depicted in FIGS. 2-10.

Figure 14:
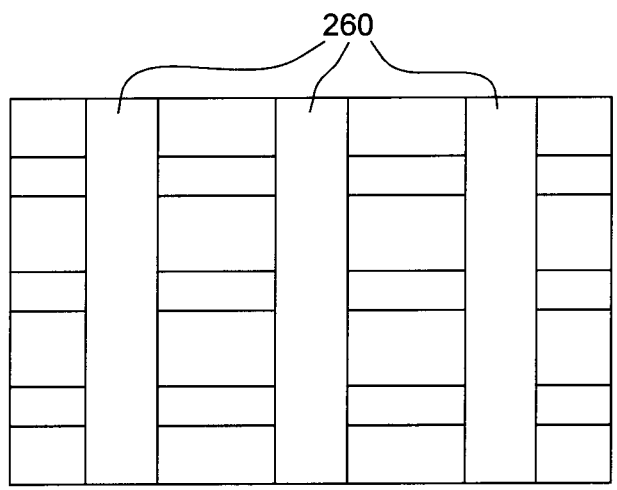
FIG. 14 depicts the structure of FIG. 13 after depositing a second lithography stack and patterning a third set of lines, in accordance with one or more aspects of the present invention.

As depicted in FIG. 14, following the etching of the combination of the first two sets of lines, a second lithography stack 525 may be deposited over the second hardmask layer 215, which is defined and exposed by the etching of the first and second set of lines 250/255, and over the third hardmask layer 220, which is now defined by the space between the first two sets of lines. A third set of lines 260 may be patterned in a second direction, for instance perpendicular to the direction of the first two sets of lines 250/255. As can be seen in FIG. 14, these lines run perpendicular to the previous lines, and are patterned in a similar photoresist layer as the first two sets of lines.

Figure 15:
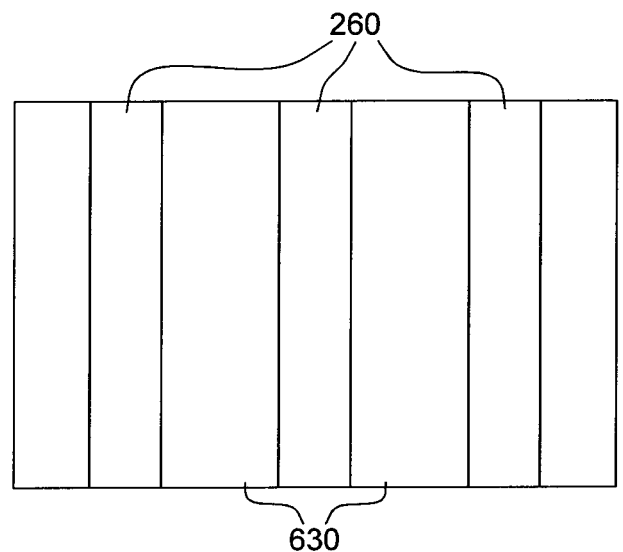
FIG. 15 depicts the structure of FIG. 14 after etching the second lithography stack to define the third set of lines in the third hardmask layer, leaving an OPL above the third hardmask layer where the third set of lines was not etched, in accordance with one or more aspects of the present invention.

As depicted in FIG. 15, a second lithography stack 525 may be etched, defining the third set of lines 260 in the underlying third hardmask layer 220, essentially causing a grid pattern in combination with the first and second set of lines 250/255 (not shown below the layers in the top down view), but leaving an OPL 630, usually left behind after etching second lithography stack 525, but it may be added after etching. In any event, OPL 630 should only be above the areas not etched in etching the third set of lines 260. In embodiments where device 200 is a SRAM cell, each line of the third set of lines 260 may be approximately 36 nm apart. The third set of lines 260 may be approximately 76 nm wide. These widths are approximate and can include +/−5 nm. It should also be understood that these values are for a particular SRAM cell, but can vary depending on the logic device desired.

Figure 16:
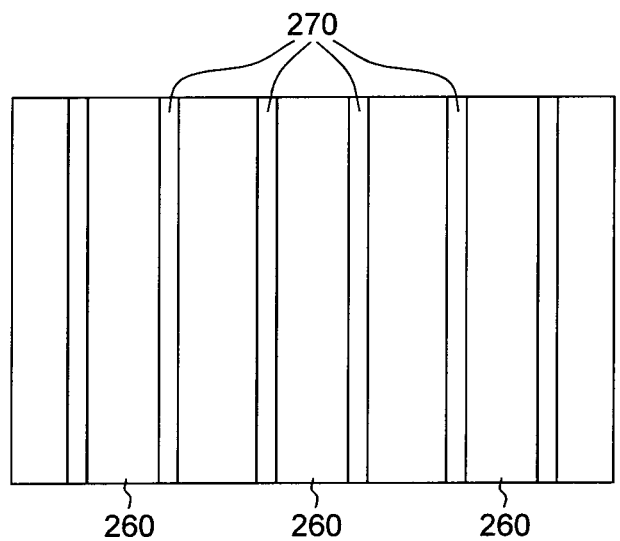
FIG. 16 depicts the structure of FIG. 15 after depositing a spacer over the OPL and the second hardmask layer in the third set of lines and etching the spacer, leaving a vertical set of spacers, in accordance with one or more aspects of the present invention.

As depicted in FIG. 16, a spacer layer 265 (not shown) is deposited over the OPL 630 where it exists, and over the second hardmask layer 215 in the third set of lines 260 and etched away to form vertical spacers 270. The processes illustrated in FIGS. 15-16 may be considered a self-aligned patterning (SAP) due to the use of spacers in the etched third set of lines 260. Thus, in some embodiments, aspects of the current disclosure include a novel combination of LELE techniques and SAP techniques to form a new structure.

Figure 17:
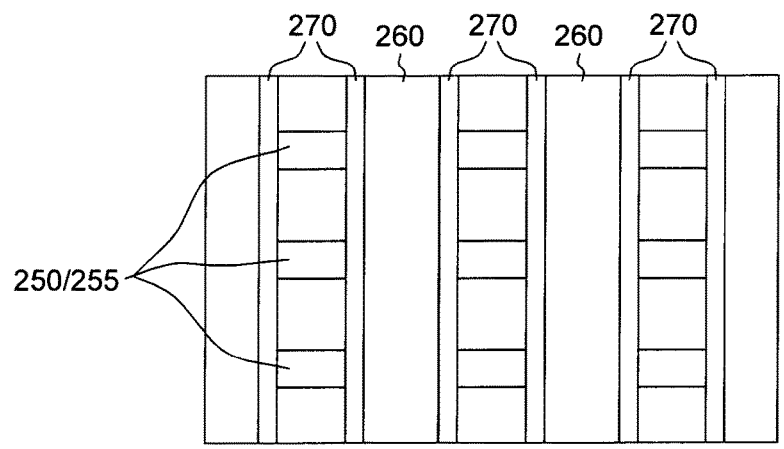
FIG. 17 depicts the structure of FIG. 16 after removing the OPL, in accordance with one or more aspects of the present invention.

As depicted in FIG. 17, the OPL 630 may be removed, leaving behind the combined pattern of the parallel first and second set of lines 250/255, broken by the perpendicular third set of lines 260 and, parallel to third set of lines 260, the set of vertical spacers 270.

Figure 18:
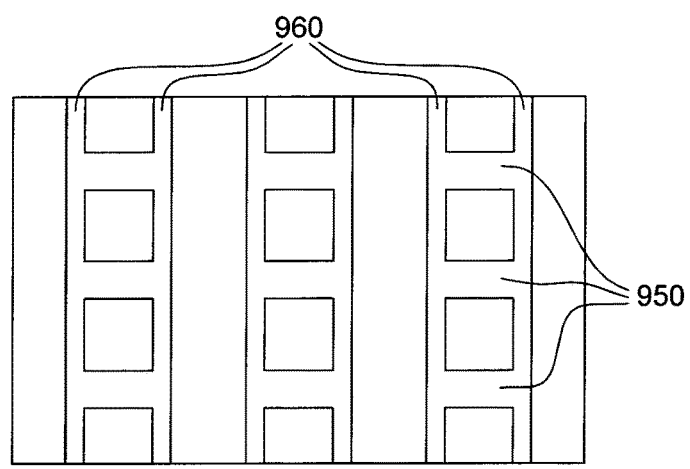
FIG. 18 depicts the structure of FIG. 17 after etching the second hardmask layer using the third hardmask layer and the set of vertical spacers as a mask, in accordance with one or more aspects of the present invention.

As depicted in FIG. 18, the third hardmask layer remaining between all sets of lines and the set of vertical spacers 270 act as a mask for etching the underlying second hardmask layer 215 to form the grid pattern illustrated. As such, a device 200 is illustrated in FIG. 18, which includes the dielectric layer 205, the first hardmask layer 210, which is partially exposed by areas not covered by the remaining second hardmask layer 215. For instance, the remaining second hardmask layer 215 has been etched to form a set of nitride lines 950 periodically, left behind by the first and second set of lines 250/255, FIGS. 11 and 12. Also formed is a set of connecting nitride lines 960 from the third set of lines 260, FIG. 14. In some embodiments, the set of nitride lines 950 are approximately 26 nm wide due to the earlier patterning, and the set of connecting nitride lines are approximately 20 nm wide. In embodiments where device 200 includes a SRAM cell, the nitride lines may be approximately 64 nm apart, typically uniformly. The connecting nitride lines 960, which are typically grouped into sets of two adjacent lines, which can be approximately 36 nm apart from any adjacent line. It is to be understood that the pattern illustrated in FIG. 18 can be useful, for instance, in an SRAM cell 200, but may be patterned differently and with different spacing depending on the desired structure and function.

Thus, using embodiments described above, combining LELE and SAP methods in a semi-bidirectional patterning technique allows for more controlled patterning. This can alleviate power issues from the prior methods and allow for better connections between the portions of device 200 or device 1800, or a combination of the methods of the two embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An intermediate semiconductor device comprising:
   a dielectric layer;
   a first hardmask layer;
   a set of nitride lines periodically in a first direction approximately 15 nm to approximately 35 nm wide; and
   a set of connecting nitride lines in a second direction approximately 10 nm to approximately 30 nm wide, wherein a width of the set of connecting nitride lines is less than a width of the set of nitride lines.

2. The device of claim 1, wherein device comprises a logic device and the nitride lines are approximately 30 nm apart.

3. The device of claim 2, wherein the connecting nitride lines are approximately 36 nm apart from an adjacent connecting nitride line.

4. The device of claim 1, wherein the device comprises an SRAM cell.

5. The device of claim 4, wherein the nitride lines are approximately 64 nm apart.

6. The device of claim 5, wherein the connecting nitride lines are approximately 36 nm apart from an adjacent connecting nitride line.

\* \* \* \* \*